United States Patent [19]

Yuhaku et al.

[11] Patent Number: 4,812,422
[45] Date of Patent: Mar. 14, 1989

[54] DIELECTRIC PASTE AND METHOD OF MANUFACTURING THE PASTE

[75] Inventors: Satoru Yuhaku, Osaka; Seiichi Nakatani, Neyagawa; Tsutomu Nishimura, Uji; Toru Ishida, Hirakata, all of Japan

[73] Assignee: Matsushita Electric Industrial Co., Ltd., Osaka, Japan

[21] Appl. No.: 869,904

[22] Filed: Jun. 3, 1986

[30] Foreign Application Priority Data

Jun. 17, 1985 [JP] Japan .................................. 60-131101
Jun. 27, 1985 [JP] Japan .................................. 60-140804

[51] Int. Cl.$^4$ ........................... C03C 8/16; C03C 8/14
[52] U.S. Cl. ......................................... 501/20; 501/17; 501/66; 501/153
[58] Field of Search .................... 501/17, 32, 20, 66, 501/153

[56] References Cited

U.S. PATENT DOCUMENTS 4,152,282  5/1979  Baudry et al. ........................ 501/67

Primary Examiner—Ferris H. Lander
Attorney, Agent, or Firm—Wenderoth, Lind & Ponack

[57] ABSTRACT

Disclosed is a dielectric paste for a ceramic multilayer wiring substrate, of which feature, among others, lies in the composition of inorganic components comprised of ceramics made of $Al_2O_3$, $SiO_2$, $CaO$ and $MgO$, and a borosilicate glass. This can be prepared by mixing a part of the glass with the ceramic, calcining the mixture at a high temperature, and then adding the remaining glass to mix with the calcined product. The insulation layer is densely formed, and a dielectric paste excelling in electric insulating property can be obtained by mixing this composition with an organic liquid.

3 Claims, No Drawings

DIELECTRIC PASTE AND METHOD OF MANUFACTURING THE PASTE

BACKGROUND OF THE INVENTION

1. Field of the Invention

This invention relates to dielectric paste used in a ceramic wiring substrate for mounting semiconductor ICs, chip components and the like, and a method of manufacturing the dielectric paste.

2. Description of the Prior Art

Recently, with the development of the semiconductor industry and progress of the general electronic component industry, ICs, LSIs and small components have come to be widely used. In such situation, ceramic multilayer wiring substrates are attracting attention because ICs and LSIs can be directly mounted thereon, and wiring density can be extremely increased.

Conventional methods of manufacturing the ceramic multilayer wiring substrates are roughly classified into two-the thick film printing method and the green sheet laminating method. In the thick film printing method, thick film paste of conductors or insulators is laminated on a sintered ceramic substrate by repeating printing and firing alternately. The advantages of this method are that the thick film paste is readily available, and that the process itself is simple. In this method, however, since glass paste is used as the thick film paste of insulators, fluidity due to softening of the glass occurs when firing, so that the desired dimensions of the finely printed conductor pattern is not maintained. Accordingly, it is required to fire every time after printing each conductor layer and insulator layer, which increases, the lead time, resulting in an increase of cost. Consequently this method it is not suited to produce a multi-layer wiring substrate with a great number of laminations. Besides, the head conductivity and mechanical strength of glass are inferior to those of alumina. On the other hand, in the green sheet laminating method, a conductor paste is printed on insulating green sheets before firing, and these green sheets are overlaid and laminated by heat and pressure, and thereafter fired. This method is preferably used in applications with a great number of laminations. The advantages of this method are that the lead time is short because of using only one firing process, and the density of the insulation layers are increased easily because of the lamination by pressure. But it had its own shortcomings. That is, since alumina was conventionally used as the insulating material, the firing temperature must be higher than 1500° C. Therefore, as the conductor material, a high melting point metal such as W or Mo must be used. But these metals are higher in conductor resistance as compared with Au, Ag or Cu, and they cannot be soldered. As a countermeasure, hence, it was necessary to coat the surface with Ni and Au.

As one of the methods to solve these problems, researches have been made into the types of dielectric paste suitable for low temperature firing by mixing glass with ceramics such as alumina and magnesia as disclosed in Japanese Laid-Open Patent Applications No. 54-82700, No. 60-8229, and No. 54-111517. The features of such dielectric paste are as follows. inorganic components in the paste are made of ceramics such as alumina and glass. The glass in the paste is softened at the time of firing to form a continuous amorphous network so that each ceramic particle is surrounded by glass. Accordingly, this structure makes the mechanical strength and heat conductivity superior to those of glass alone. Actually, however it is not easy to exhibit the above features fully. One of the reasons for this is that it is not easy to uniformly mix glass and alumina which differ in particle size and specific gravity. Another reason is that wetability and reactivity which are important for promoting sintering of glass and ceramics are not so good. Wwhen these properties are insufficient, in the method of softening of the glass to form the glass network by firing, lumps of ceramic powder are scattered about among the gaps in the glass network, and the chemical reaction between glass and ceramics does not occur easily. As a result, the insulation layer after firing is porous, so that the mechanical strength, insulation resistance, an break-down voltage of the insulation layers are lowered.

SUMMARY OF THE INVENTION

It is hence a primary object of this invention to provide a dielectric paste capable of forming dense insulating layers at a low temperature by co-firing after alternately laminating conductor layers and insulator layers to make up a multilayer structure.

In order to achieve this object, the dielectric paste of this invention has inorganic components which are composed of ceramics made of four compounds, that is, $Al_2O_3$, $SiO_2$, $MgO$, and $CaO$, and borosilicate glass. Before blending the ceramics and glass, a part of the glass powder is mixed with the ceramic powder, and calcined at a higher temperature than the firing temperature of the dielectric paste to produce a desired reaction product of ceramic powder and glass powder. Thereafter, the remaining glass powder is added and mixed with the reaction product.

This invention, by the above-mentioned composition of dielectric paste and method, makes it possible to produce an insulator layer of a ceramic multilayer wiring substrate at an extremely high density, which results in notably advanced electric insulation properties.

DETAILED DESCRIPTION OF THE INVENTION

One of the features of the dielectric paste of this invention is the use of a composition of ceramics/glass, comprising ceramics made of four components-$Al_2O_3$, $SiO_2$, $MgO$, and $CaO$—and borosilicate glass, as inorganic components in the paste. The ceramics/glass ratio is 40/60 to 60/40 in weight ratio. More specifically, this is glass-ceramic powder produced by mixing a compound ceramic powder mainly composed of $Al_2O_3$ with proper addition of $SiO_2$, $MgO$ and $CaO$, and a borosilicate glass powder thereto, and it is different from conventional glass-ceramic powders made of glass blended with $Al_2O_3$, $MgO$ or $SiO_2$ alone, or their compound $MgO \cdot Al_2O_3$, $2MgO \cdot SiO_2$ or $3MgO \cdot 4SiO_2$ alone. In the conventional glass-ceramics, the wettability of ceramics and glass at the firing was inferior, and the ceramics and glass did not react with each other easily, so that the obtained insulation layers were porous and thus poor in mechanical strength and insulating properties. By contrast, in this invention, $SiO_2$, $MgO$, and $CaO$ are added to $Al_2O_3$, and by their compound addition effect, the wettability with glass at the firing is improved so as to react with the glass easily, so that sintering is promoted and a dense insulation layer is formed. The mixing ratio of the ceramics and glass must be properly selected so as to be neither too much nor too little. The reason for this is, if the glass content is too small, the glass softened at the firing cannot cover the entire particles of the ceramic powder, and lumps of the ceramic powder are scattered about in the insulation layer, which may lead to deterioration of mechanical strength or insulation properties. If the glass content is too much, extra glass phase are formed among ceramic particles, which may cause blistering to adversely affect the insulation properties.

Another feature of this invention lies in the two-step method. That is, before the mixing ceramics and glass powders, a part of the glass powder is mixed with the ceramic powder, and the mixture is calcined at a higher temperature than the firing temperature of the dielectric paste to produce a desired reaction product of ceramics and glass, and then the remaining glass is added to mix with the reaction product. By calcining the ceramics and glass at a high temperature, about 1300° C., the ceramics and glass react with each other, a very thin reaction product and glass layer are formed on the surface of ceramic particles, which improves the wettability with the raw glass at the firing, so that the sintering can be further promoted.

In the above-mentioned composition, the dielectric paste of this invention is extremely increased in the density of the insulation layer, in insulation resistance and in break-down voltage, so as to be usable as a dielectric paste for a ceramic multilayer wiring substrate. The effects of this invention are not limited to the thick film paste, but may be also expected in the dielectric paste for the green sheet method. Moreover, the conductor paste used in this invention is not limited to Ag/Pd, Au, but may be effective also if Cu is used as the conductor.

EXAMPLE 1

In the first place, glass-ceramic mixture powders were prepared as the inorganic components of the dielectric paste of this invention, which are shown in TABLE 1.

The glass powder was weighed according to the glass composition shown in TABLE 1, mixed in an agate mortar, put into a platinum crucible, and melted in an electric furnace at 1300° to 1400° C. Right after the melting, the molten glass was quickly cooled in water to obtain a lump of glass. This lump of glass was roughly crushed in the agate mortar, further grounded in the presence of ethyl alcohol for 70 hours in an alumina ball mill, and dried to obtain a glass powder with an average particle size of 2 to 3 $\mu$m. On the other hand, the ceramic powder was weighed according to the ceramic composition shown in TABLE 1, mixed in the presence of ethyl alcohol for 17 hours in an alumina ball mill, and was dried. Thus obtained glass powder and ceramic powder were weighed in a specified glass/ceramic ratio in TABLE 1, mixed in the presence of ethyl alcohol for 17 hours in an alumina ball mill, and dried to obtain a mixed powder of glass and ceramics.

In the next step, this glass-ceramic powder was formed under a pressure of 500 kg/cm$^2$, and fired at 1000° C. in air to obtain a sample of 20 mm in diameter and 3 mm in thickness. Besides, an organic vehicle having ethyl cellulose dissolved in turpentine oil was added to this glass-ceramic mixed powder, and the mixture was kneaded in a three-roll mill to obtain a paste. then, on a sintered alumina substrate, a commercial Ag-Pd conductor paste and this dielectric pate were alternately printed to make up a multilayer structure comprising four layers of conductor and three layers of insulation layer, and it was fired at 1000° C. in air to obtain a multilayer wiring substrate. The thickness of the insulation layer after the firing was 35 to 45 $\mu$m. The opposing area of the conductor electrode across the insulation layer was 100 mm$^2$. The porosity and insulation resistance of the insulation layers of these samples were measured, and THB test was conducted by applying a DC voltage of 50 volts between the insulation layers at a temperature of 85° C. and a humidity of 85%. The results are shown in TABLE 2. It was thus known that the porosity and insulation resistance were improved when the ceramic composition was made of four components—Al$_2$O$_3$, SiO$_2$, CaO, and MgO. And the effects of improvement were great when the mixing ratio of ceramics/glass by weight was in the range of 40/60 to 60/40. When these samples were observed by SEM, the insulation layer was found to be dense, being free from pin holes.

EXAMPLE 2

In EXAMPLE 1, it was revealed that the sinterabilty of the insulation layer was enhanced by making up the ceramic composition by mixing Al$_2$O$_3$, SiO$_2$, CaO, and MgO. In EXAMPLE 2, to study more in detail, the ceramic composition and glass composition were varied minutely, and the porosity, break-down voltage and THB test were investigated. The methods of preparing and testing the glass-ceramic mixed powders were same as those in EXAMPLE 1.

The sample compositions of glass-ceramic mixed powder are shown in TABLE 3, and the test results are shown in TABLE 4.

As a result, effects of improvements were noted in the range of 09 to 98 wt.% of Al$_2$O$_3$, 1 to 5 wt.% of SiO$_2$, 0.2 to 2 wt.% of CaO, and 0.5 to 4 wt.% for MgO for the ceramic composition, and 60 to 90 wt.% of SiO$_2$, 5 to 30 wt.% of B$_2$O$_3$, 0.1 to 10 wt.% of Al$_2$O$_3$, 0.1 to 10 wt.% of BaO, and 0.1 to 6 wt.% M$_2$O for the glass composition.

EXAMPLE 3

Glass powders and ceramic powders differing in composition as shown in TABLE 5, TABLE 6 were prepared. The preparing method of the glass powder and ceramic powder was same as that in EXAMPLE 1. Thus prepared glass powder and ceramic powder were weighed at the glass/ceramic ratio by weight of 30/70, 40/50, 50/50, 60/40, and 70/30. Next, a half of the weighed glass powder was mixed with the ceramic powder in the presence of ethyl alcohol for 17 hours in an alumina ball mill. The mixture was dried, and calcined at 1300° C. for 2 hours in an electric furnace in air. The remaining glass powder was added to this calcined powder, mixed in the presence of ethyl alcohol for 70 hours in an alumina ball mill (this mixing also serves as pulverising), and dried to obtain a glass-ceramic mixed powder with an average particle size of 2 to 3 $\mu$m. to this glass-ceramic mixed powder, an organic vehicle made by dissolving ethyl cellulose in turpentine oil was added, and the mixture was kneaded in a three-roll mill to obtain a paste. Then, on a sintered alumina substrate, a commercial Au conductor paste was printed and dried, and this dielectric paste was printed so that the thickness after firing became 20, 40 and 60 $\mu$m. After drying, the Au conductor paste was further printed and dried. This substrate was fired at 900° C. in an electric furnace in air. The obtained insulation layer was dense and its surface was smooth. Short-circuit test was done between two electrodes at both sides of the insulation layer of this sample by using a circuit tester. Furthermore, a DC voltage was applied between the two electrodes to measure the break-down voltage of the insulation layer. The results are shown in TABLE 7.

From this table it is evident that the sample calcined together with the glass powder was improved in the short-circuit check and break-down voltage, as compared with the uncalcined sample. this effect is greater in the mixing ratio of glass powder/ceramic powder of 40/60 to 60/40 than the others.

EXAMPLE 4

In EXAMPLE 3 it was proved that the break-down voltage was improved when calcined together with the glass powder. In EXAMPLE 4, the ceramic composition, glass composition, and the part of the glass to be calcined together with the ceramic powder were varied more minutely, and the same investigations as in EXAMPLE 3 were made. The glass composition and ceramic composition are shown in TABLES 5, 6.

The results are shown in TABLE 8.

As a result, the effects of improvement were noted in the range of 09 to 98 wt.% of $Al_2O_3$, 1 to 5 wt.% of $SiO_2$, 0.2 to 2 wt.% of CaO, and 0.5 to 4 wt.% of MgO for the ceramic composition, and 60 to 90 wt.% of $SiO_2$, 5 to 30 wt. % of $B_2O_3$, 0.1 to 10 wt.% of $Al_2O_3$, 0.1 to 10 wt.% of BaO, and 0.1 to 6 wt.% of $M_2O$ for the glass composition. The part of the glass to be calcined with ceramic powder was proper between 2 and 40 wt.%.

TABLE 1

Glass-Ceramic Mixed Powder Composition

| No. | $SiO_2$ | $B_2O_3$ | $Al_2O_3$ | BaO | $Na_2O$ | $K_2O$ | $Li_2O$ | Glass/ceramic (ratio by weight %) | $Al_2O_3$ | $SiO_2$ | CaO | MgO |
|---|---|---|---|---|---|---|---|---|---|---|---|---|
| 1 | 60 | 30 | 5 | 3 | 1 | 0.6 | 0.4 | 50/50 | 100 | 0 | 0 | 0 |
| 2 | | | | | | | | | 95 | 5 | 0 | 0 |
| 3 | | | | | | | | | 95 | 0 | 5 | 0 |
| 4 | | | | | | | | | 95 | 0 | 0 | 5 |
| 5 | | | | | | | | | 95 | 2 | 3 | 0 |
| 6 | | | | | | | | | 95 | 2 | 1 | 2 |
| 7 | | | | | | | | 30/70 | 100 | 0 | 0 | 0 |
| 8 | | | | | | | | | 95 | 5 | 0 | 0 |
| 9 | | | | | | | | | 95 | 0 | 5 | 0 |
| 10 | | | | | | | | | 95 | 2 | 1 | 2 |
| 11 | | | | | | | | | 95 | 2 | 2 | 1 |
| 12 | | | | | | | | | 95 | 1 | 2 | 2 |
| 13 | | | | | | | | 40/60 | 100 | 0 | 0 | 0 |
| 14 | | | | | | | | | 95 | 5 | 0 | 0 |
| 15 | | | | | | | | | 95 | 0 | 5 | 0 |
| 16 | | | | | | | | | 95 | 2 | 1 | 2 |
| 17 | | | | | | | | | 95 | 2 | 2 | 1 |
| 18 | | | | | | | | | 95 | 1 | 2 | 2 |
| 19 | 70 | 20 | 5 | 3 | 1 | 0.6 | 0.4 | 50/50 | 100 | 0 | 0 | 0 |
| 20 | | | | | | | | | 95 | 5 | 0 | 0 |
| 21 | | | | | | | | | 95 | 0 | 5 | 0 |
| 22 | | | | | | | | | 95 | 2 | 1 | 2 |
| 23 | | | | | | | | | 95 | 2 | 2 | 1 |
| 24 | | | | | | | | | 95 | 1 | 2 | 2 |
| 25 | | | | | | | | 60/40 | 100 | 0 | 0 | 0 |
| 26 | | | | | | | | | 95 | 5 | 0 | 0 |
| 27 | | | | | | | | | 95 | 0 | 5 | 0 |
| 28 | | | | | | | | | 95 | 2 | 1 | 2 |
| 29 | | | | | | | | | 95 | 2 | 2 | 1 |
| 30 | | | | | | | | | 95 | 1 | 2 | 2 |
| 31 | | | | | | | | 70/30 | 100 | 0 | 0 | 0 |
| 32 | | | | | | | | | 95 | 5 | 0 | 0 |
| 33 | | | | | | | | | 95 | 0 | 5 | 0 |
| 34 | | | | | | | | | 95 | 2 | 1 | 2 |
| 35 | | | | | | | | | 95 | 2 | 2 | 1 |
| 36 | | | | | | | | | 95 | 1 | 2 | 2 |
| 37 | 80 | 10 | 5 | 3 | 1 | 0.6 | 0.4 | 50/50 | 100 | 0 | 0 | 0 |
| 38 | | | | | | | | | 95 | 5 | 0 | 0 |
| 39 | | | | | | | | | 95 | 0 | 5 | 0 |
| 40 | | | | | | | | | 95 | 0 | 0 | 5 |
| 41 | | | | | | | | | 95 | 2 | 0 | 3 |
| 42 | | | | | | | | | 95 | 2 | 1 | 2 |

TABLE 2

THB Test

| No. | Porosity (%) | Initial insulation resistance ($\Omega$) | Insulation resistance in 1000 hrs ($\Omega$) |
|---|---|---|---|
| 1 | >5 | $7.5 \times 10^{11}$ | $<10^{11}$ |
| 2 | >5 | $6 \times 10^{12}$ | $1.5 \times 10^{11}$ |
| 3 | >5 | $8.5 \times 10^{12}$ | $6 \times 10^{11}$ |
| 4 | 4 | $1.5 \times 10^{13}$ | $2.5 \times 10^{12}$ |
| 5 | 2 | $2.5 \times 10^{13}$ | $7.5 \times 10^{12}$ |
| 6 | <1 | $6 \times 10^{13}$ | $5 \times 10^{13}$ |
| 7 | >5 | $8.5 \times 10^{12}$ | $1.3 \times 10^{11}$ |
| 8 | >5 | $7.6 \times 10^{12}$ | $6.5 \times 10^{11}$ |
| 9 | >5 | $5.5 \times 10^{12}$ | $5.1 \times 10^{11}$ |
| 10 | 2 | $1.1 \times 10^{13}$ | $7.5 \times 10^{12}$ |
| 11 | <1 | $1.7 \times 10^{13}$ | $9 \times 10^{12}$ |
| 12 | <1 | $2.5 \times 10^{13}$ | $1.1 \times 10^{13}$ |
| 13 | >5 | $7.6 \times 10^{12}$ | $<10^{11}$ |
| 14 | >5 | $5.5 \times 10^{12}$ | $1.6 \times 10^{11}$ |
| 15 | 3 | $3.5 \times 10^{12}$ | $1.8 \times 10^{11}$ |
| 16 | <2 | $8.6 \times 10^{12}$ | $4 \times 10^{12}$ |
| 17 | <1 | $1.9 \times 10^{13}$ | $0.95 \times 10^{13}$ |
| 18 | <1 | $5 \times 10^{13}$ | $4.1 \times 10^{13}$ |

TABLE 2-continued

| No. | Porosity (%) | THB Test — Life test (THB) Initial insulation resistance (Ω) | Insulation resistance in 1000 hrs (Ω) |
|---|---|---|---|
| 19 | >5 | $5 \times 10^{11}$ | $<10^{11}$ |
| 20 | >5 | $7.5 \times 10^{11}$ | $<10^{11}$ |
| 21 | >5 | $6 \times 10^{12}$ | $2 \times 10^{12}$ |
| 22 | 4 | $1 \times 10^{13}$ | $3.5 \times 10^{12}$ |
| 23 | 3 | $2.5 \times 10^{13}$ | $6 \times 10^{12}$ |
| 24 | <1 | $5 \times 10^{13}$ | $4.5 \times 10^{12}$ |
| 25 | >5 | $6.3 \times 10^{11}$ | $<10^{11}$ |
| 26 | >5 | $7.6 \times 10^{11}$ | $<10^{11}$ |
| 27 | >5 | $1.0 \times 10^{12}$ | $1.8 \times 10^{11}$ |
| 28 | 1.5 | $8.1 \times 10^{12}$ | $2 \times 10^{12}$ |
| 29 | <1 | $7.5 \times 10^{12}$ | $5.5 \times 10^{12}$ |
| 30 | <1 | $3.1 \times 10^{12}$ | $3.1 \times 10^{12}$ |
| 31 | >5 | $7.1 \times 10^{11}$ | $1.0 \times 10^{11}$ |
| 32 | >5 | $1.2 \times 10^{12}$ | $1.3 \times 10^{11}$ |
| 33 | 4 | $2 \times 10^{12}$ | $0.54 \times 10^{12}$ |
| 34 | 2 | $4.1 \times 10^{12}$ | $3.6 \times 10^{12}$ |
| 35 | <1 | $7.5 \times 10^{12}$ | $6.1 \times 10^{12}$ |
| 36 | <1 | $1.1 \times 10^{13}$ | $0.9 \times 10^{13}$ |
| 37 | >5 | $1 \times 10^{11}$ | $<10^{11}$ |
| 38 | >5 | $3 \times 10^{11}$ | $<10^{11}$ |
| 39 | >5 | $1.5 \times 10^{12}$ | $<10^{11}$ |
| 40 | >5 | $4 \times 10^{12}$ | $3.5 \times 10^{11}$ |
| 41 | 3 | $1.5 \times 10^{13}$ | $4 \times 10^{12}$ |
| 42 | <1 | $5 \times 10^{13}$ | $5 \times 10^{13}$ |

TABLE 3

Glass-Ceramic Mixed Powder Composition

| No. | $SiO_2$ | $B_2O_3$ | $Al_2O_3$ | BaO | $Na_2O$ | $K_2O$ | $Li_2O$ | Glass/ceramic (ratio by weight %) | $Al_2O_3$ | $SiO_2$ | CaO | MgO |
|---|---|---|---|---|---|---|---|---|---|---|---|---|
| 43 | 55 | 35 | 5 | 3 | 1 | 0.6 | 0.4 | 50/50 | 90 | 4 | 2 | 3 |
| 44 | | | | | | | | | 94 | 3 | 1 | 2 |
| 45 | | | | | | | | | 97 | 1.5 | 0.5 | 1 |
| 46 | 60 | 30 | 5 | 3 | 1 | 0.6 | 0.4 | | 90 | 4 | 2 | 3 |
| 47 | | | | | | | | | 94 | 3 | 1 | 2 |
| 48 | | | | | | | | | 97 | 1.5 | 0.5 | 1 |
| 49 | 70 | 10 | 9.99 | 10 | 0.01 | 0 | 0 | 50/50 | 94 | 3 | 1 | 2 |
| 50 | | | 10 | 9.99 | | | | | | | | |
| 51 | | 15 | 7 | 7.95 | 0.05 | | | | | | | |
| 52 | | | | 7.9 | 0.1 | | | | | | | |
| 53 | | | | 4.7 | 0.2 | 0.1 | | | | | | |
| 54 | | | | 4.3 | 0.4 | 0.2 | 0.1 | | | | | |
| 55 | | | | 4 | 0.5 | 0.3 | 0.2 | | | | | |
| 56 | | | | | | | | 30/70 | 88 | 5 | 2 | 5 |
| 57 | | | | | | | | | 90 | 5 | 1 | 4 |
| 58 | | | | | | | | | 92 | 3 | 1 | 4 |
| 59 | | | | | | | | | 94 | 2 | 2 | 2 |
| 60 | | | | | | | | | 94 | 4 | 0.1 | 1.9 |
| 61 | | | | | | | | | 94 | 3 | 1 | 2 |
| 62 | | | | | | | | | 94 | 5 | 0.8 | 0.2 |
| 63 | | | | | | | | | 96 | 2 | 0.5 | 1.5 |
| 64 | | | | | | | | | 98 | 1 | 0.5 | 0.5 |
| 65 | | | | | | | | | 100 | 0 | 0 | 0 |
| 66 | | | | | | | | 40/60 | 88 | 5 | 2 | 5 |
| 67 | | | | | | | | | 90 | 5 | 1 | 4 |
| 68 | | | | | | | | | 92 | 3 | 1 | 4 |
| 69 | | | | | | | | | 94 | 2 | 2 | 2 |
| 70 | | | | | | | | | 94 | 4 | 0.1 | 1.9 |
| 71 | | | | | | | | | 94 | 3 | 1 | 2 |
| 72 | | | | | | | | | 94 | 5 | 0.8 | 0.2 |
| 73 | | | | | | | | | 96 | 2 | 0.5 | 1.5 |
| 74 | | | | | | | | | 98 | 1 | 0.5 | 0.5 |
| 75 | | | | | | | | | 100 | 0 | 0 | 0 |
| 76 | 70 | 20 | 5 | 3 | 1 | 0.6 | 0.4 | 50/50 | 88 | 5 | 2 | 5 |
| 77 | | | | | | | | | 90 | 5 | 1 | 4 |
| 78 | | | | | | | | | 92 | 3 | 1 | 4 |
| 79 | | | | | | | | | 94 | 2 | 2 | 2 |
| 80 | | | | | | | | | 94 | 4 | 0.1 | 1.9 |
| 81 | | | | | | | | | 94 | 3 | 1 | 2 |
| 82 | | | | | | | | | 94 | 5 | 0.8 | 0.2 |
| 83 | | | | | | | | | 96 | 2 | 0.5 | 1.5 |
| 84 | | | | | | | | | 98 | 1 | 0.5 | 0.5 |
| 85 | | | | | | | | | 100 | 0 | 0 | 0 |
| 86 | | | | | | | | 60/40 | 88 | 5 | 2 | 5 |
| 87 | | | | | | | | | 90 | 5 | 1 | 4 |
| 88 | | | | | | | | | 92 | 3 | 1 | 4 |
| 89 | | | | | | | | | 94 | 2 | 2 | 2 |
| 90 | | | | | | | | | 94 | 4 | 0.1 | 1.9 |
| 91 | | | | | | | | | 94 | 3 | 1 | 2 |
| 92 | | | | | | | | | 94 | 5 | 0.8 | 0.2 |
| 93 | | | | | | | | | 96 | 2 | 0.5 | 1.5 |
| 94 | | | | | | | | | 98 | 1 | 0.5 | 0.5 |
| 95 | | | | | | | | | 100 | 0 | 0 | 0 |
| 96 | | | | | | | | 70/30 | 88 | 5 | 2 | 5 |

TABLE 3-continued

Glass-Ceramic Mixed Powder Composition

| | Glass composition | | | | | | | Glass/ceramic (ratio by weight %) | Ceramic composition | | | |
|---|---|---|---|---|---|---|---|---|---|---|---|---|
| No. | SiO₂ | B₂O₃ | Al₂O₃ | BaO | Na₂O | K₂O | Li₂O | | Al₂O₃ | SiO₂ | CaO | MgO |
| 97 | | | | | | | | | 90 | 5 | 1 | 4 |
| 98 | | | | | | | | | 92 | 3 | 1 | 4 |
| 99 | | | | | | | | | 94 | 2 | 2 | 2 |
| 100 | | | | | | | | | 94 | 4 | 0.1 | 1.9 |
| 101 | | | | | | | | | 94 | 3 | 1 | 2 |
| 102 | | | | | | | | | 94 | 5 | 0.8 | 0.2 |
| 103 | | | | | | | | | 96 | 2 | 0.5 | 1.5 |
| 104 | | | | | | | | | 98 | 1 | 0.5 | 0.5 |
| 105 | | | | | | | | | 100 | 0 | 0 | 0 |
| 106 | 80 | | 4 | | 1.5 | 0.9 | 0.6 | 50/50 | 94 | 3 | 1 | 2 |
| 107 | | | | 2 | 2 | 1.2 | 0.8 | | | | | |
| 108 | | | 3 | | 2.5 | 1.5 | 1 | | | | | |
| 109 | | | | 1 | 3 | 1.8 | 1.2 | | | | | |
| 110 | | | 2 | | 3.5 | 2.1 | 1.4 | | | | | |
| 111 | | 15 | 1 | 0.5 | 1.8 | 1 | 0.7 | | | | | |
| 112 | | | 0.5 | | 2.5 | 1.5 | 1 | | | | | |
| 113 | | | 0.1 | 0.1 | 2.4 | 1.4 | | | | | | |
| 114 | | 10 | 5 | 3 | 1 | 0.6 | 0.4 | 50/50 | 90 | 4 | 2 | 3 |
| 115 | | | | | | | | | 94 | 3 | 1 | 2 |
| 116 | 90 | 5 | 2 | 1 | | | | | 90 | 4 | 2 | 3 |
| 117 | | | | | | | | | 94 | 3 | 1 | 2 |
| 118 | 95 | 3 | 0.5 | 0.5 | 0.5 | 0.3 | 0.2 | | 97 | 1.5 | 0.5 | 1 |

TABLE 4

THB Test

| No. | Porosity (%) | Initial insulation resistance (Ω) | Insulation resistance in 1000 hrs (Ω) |
|---|---|---|---|
| 43 | 2 | $1 \times 10^{13}$ | $6 \times 10^{12}$ |
| 44 | 3 | $2.5 \times 10^{13}$ | $3.5 \times 10^{12}$ |
| 45 | 3 | $1.5 \times 10^{13}$ | $2 \times 10^{12}$ |
| 46 | <1 | $5 \times 10^{13}$ | $4.5 \times 10^{13}$ |
| 47 | <1 | $5.5 \times 10^{13}$ | $5.5 \times 10^{13}$ |
| 48 | <1 | $4.5 \times 10^{13}$ | $4.5 \times 10^{13}$ |
| 49 | <1 | $2 \times 10^{13}$ | $2 \times 10^{13}$ |
| 50 | <1 | $3 \times 10^{13}$ | $2.5 \times 10^{13}$ |
| 51 | <1 | $3 \times 10^{13}$ | $3 \times 10^{13}$ |
| 52 | <1 | $4 \times 10^{13}$ | $3.5 \times 10^{13}$ |
| 53 | <1 | $4 \times 10^{13}$ | $4 \times 10^{13}$ |
| 54 | <1 | $5 \times 10^{13}$ | $4 \times 10^{12}$ |
| 55 | <1 | $4.5 \times 10^{13}$ | $4.5 \times 10^{12}$ |
| 56 | 3 | $1 \times 10^{12}$ | $5 \times 10^{11}$ |
| 57 | 2 | $5 \times 10^{12}$ | $1 \times 10^{11}$ |
| 58 | 2 | $4.5 \times 10^{12}$ | $1 \times 10^{11}$ |
| 59 | 2 | $2 \times 10^{12}$ | $1.5 \times 10^{12}$ |
| 60 | 3 | $1 \times 10^{12}$ | $7 \times 10^{11}$ |
| 61 | <1 | $2 \times 10^{13}$ | $1 \times 10^{13}$ |
| 62 | 3 | $1 \times 10^{12}$ | $5 \times 10^{11}$ |
| 63 | 2 | $3.5 \times 10^{12}$ | $2 \times 10^{12}$ |
| 64 | 2 | $5 \times 10^{12}$ | $2 \times 10^{12}$ |
| 65 | 4 | $7 \times 10^{11}$ | $3 \times 10^{10}$ |
| 66 | 2 | $5 \times 10^{12}$ | $2 \times 10^{12}$ |
| 67 | <1 | $4 \times 10^{13}$ | $4 \times 10^{13}$ |
| 68 | <1 | $3 \times 10^{13}$ | $3 \times 10^{13}$ |
| 69 | <1 | $2.5 \times 10^{13}$ | $1 \times 10^{13}$ |
| 70 | 2 | $1 \times 10^{13}$ | $6 \times 10^{12}$ |
| 71 | <1 | $2.5 \times 10^{13}$ | $2 \times 10^{13}$ |
| 72 | 2 | $2 \times 10^{12}$ | $1.5 \times 10^{12}$ |
| 73 | <1 | $2 \times 10^{13}$ | $2 \times 10^{13}$ |
| 74 | <1 | $4 \times 10^{13}$ | $4 \times 10^{13}$ |
| 75 | 2 | $5 \times 10^{12}$ | $4 \times 10^{11}$ |
| 76 | 2 | $2 \times 10^{12}$ | $7 \times 10^{11}$ |
| 77 | <1 | $3.5 \times 10^{13}$ | $2.5 \times 10^{13}$ |
| 78 | <1 | $1.5 \times 10^{13}$ | $1.5 \times 10^{13}$ |
| 79 | <1 | $5 \times 10^{13}$ | $4 \times 10^{13}$ |
| 80 | 2 | $4 \times 10^{12}$ | $1 \times 10^{12}$ |
| 81 | <1 | $5 \times 10^{13}$ | $5.5 \times 10^{12}$ |
| 82 | 2 | $1 \times 10^{13}$ | $6 \times 10^{12}$ |
| 83 | <1 | $4.5 \times 10^{13}$ | $4.5 \times 10^{13}$ |
| 84 | <1 | $3 \times 10^{13}$ | $2 \times 10^{13}$ |
| 85 | 2 | $5 \times 10^{12}$ | $1 \times 10^{12}$ |
| 86 | 2 | $8 \times 10^{12}$ | $3 \times 10^{12}$ |
| 87 | <1 | $2 \times 10^{13}$ | $2 \times 10^{13}$ |
| 88 | <1 | $4 \times 10^{13}$ | $4 \times 10^{13}$ |
| 89 | <1 | $1 \times 10^{13}$ | $1 \times 10^{13}$ |
| 90 | 2 | $3.5 \times 10^{12}$ | $9 \times 10^{11}$ |
| 91 | <1 | $3 \times 10^{13}$ | $2 \times 10^{13}$ |
| 92 | 2 | $3.5 \times 10^{12}$ | $1 \times 10^{12}$ |
| 93 | <1 | $5.5 \times 10^{13}$ | $4 \times 10^{13}$ |
| 94 | <1 | $4 \times 10^{13}$ | $4 \times 10^{13}$ |
| 95 | 3 | $1 \times 10^{12}$ | $5 \times 10^{11}$ |
| 96 | 2 | $2 \times 10^{12}$ | $1 \times 10^{12}$ |
| 97 | <1 | $6 \times 10^{13}$ | $6 \times 10^{13}$ |
| 98 | <1 | $2 \times 10^{13}$ | $1 \times 10^{13}$ |
| 99 | <1 | $2 \times 10^{13}$ | $2 \times 10^{13}$ |
| 100 | 2 | $2 \times 10^{12}$ | $8 \times 10^{11}$ |
| 101 | <1 | $3.5 \times 10^{13}$ | $3 \times 10^{13}$ |
| 102 | 2 | $7.5 \times 10^{12}$ | $1 \times 10^{12}$ |
| 103 | <1 | $2.5 \times 10^{13}$ | $2.5 \times 10^{13}$ |
| 104 | <1 | $1 \times 10^{13}$ | $1 \times 10^{13}$ |
| 105 | 3 | $1 \times 10^{12}$ | $7 \times 10^{11}$ |
| 106 | <1 | $5 \times 10^{13}$ | $4.5 \times 10^{13}$ |
| 107 | <1 | $4.5 \times 10^{13}$ | $4.5 \times 10^{13}$ |
| 108 | <1 | $4.5 \times 10^{13}$ | $5 \times 10^{13}$ |
| 109 | <1 | $5 \times 10^{13}$ | $4.5 \times 10^{13}$ |
| 110 | 2 | $3 \times 10^{13}$ | $8.5 \times 10^{12}$ |
| 111 | <1 | $4.5 \times 10^{13}$ | $5 \times 10^{13}$ |
| 112 | <1 | $6 \times 10^{13}$ | $6 \times 10^{13}$ |
| 113 | <1 | $4.5 \times 10^{13}$ | $5 \times 10^{13}$ |
| 114 | <1 | $5.5 \times 10^{13}$ | $5 \times 10^{13}$ |
| 115 | <1 | $4 \times 10^{13}$ | $3.5 \times 10^{13}$ |
| 116 | <1 | $4 \times 10^{13}$ | $4 \times 10^{13}$ |
| 117 | <1 | $3 \times 10^{13}$ | $2 \times 10^{13}$ |
| 118 | 3 | $9 \times 10^{12}$ | $1 \times 10^{13}$ |

TABLE 5

Glass composition

| Sample No. | SiO₂ | B₂O₃ | Al₂O₃ | BaO | Na₂O | K₂O | Li₂O |
|---|---|---|---|---|---|---|---|
| 1 | 60 | 30 | 5 | 3 | 1 | 0.6 | 0.4 |
| 2 | 70 | 20 | 5 | 3 | 1 | 0.6 | 0.4 |
| 3 | 80 | 10 | 5 | 3 | 1 | 0.6 | 0.4 |

TABLE 5-continued

| Sample No. | SiO$_2$ | B$_2$O$_3$ | Al$_2$O$_3$ | BaO | Na$_2$O | K$_2$O | Li$_2$O |
|---|---|---|---|---|---|---|---|
| 4 | 70 | 20 | 3 | 1 | 2 | 2 | 2 |
| 5 | 70 | 10 | 9.99 | 10 | 0.01 | 0 | 0 |
| 6 | 80 | 15 | 0.1 | 0.1 | 2.4 | 1.4 | 1 |
| 7 | 75 | 5 | 10 | 5 | 2 | 2 | 1 |
| 8 | 90 | 5 | 2 | 1 | 1 | 0.6 | 0.4 |

TABLE 6

| Sample No. | Al$_2$O$_3$ | SiO$_2$ | CaO | MgO |
|---|---|---|---|---|
| 1 | 94 | 3 | 1 | 2 |
| 2 | 94 | 2 | 2 | 2 |
| 3 | 90 | 4 | 2 | 4 |
| 4 | 94 | 5 | 0.2 | 0.8 |
| 5 | 98 | 1 | 0.5 | 0.5 |

TABLE 7

| No. | Glass composition No. | Ceramic composition No. | Glass/ceramic (ratio by weight %) | Glass heated with ceramics (wt. %) | Glass to be added later (wt. %) | Insulation layer thick. (μm) | Short-circuit check defectives/samples | Break-down voltage (kv) |
|---|---|---|---|---|---|---|---|---|
| 119 | 1 | 1 | 50/50 | 0 | 50 | 20 | 10/10 | 0 |
| | | | | | | 40 | 10/10 | 0 |
| | | | | | | 60 | 3/10 | 0.4~0.8 |
| 120 | | | 30/70 | 15 | 15 | 20 | 5/10 | 0.2~0.4 |
| | | | | | | 40 | 3/10 | 0.2~0.4 |
| | | | | | | 60 | 3/10 | 0.5~1.5 |
| 121 | | | 40/60 | 20 | 20 | 20 | 1/10 | 0.5~1.0 |
| | | | | | | 40 | 1/10 | 1.0~1.4 |
| | | | | | | 60 | 0/10 | 1.2~1.5 |
| 122 | | | 50/50 | 25 | 25 | 20 | 0/10 | 0.8~1.0 |
| | | | | | | 40 | 0/10 | 1.2~1.3 |
| | | | | | | 60 | 0/10 | 1.2~1.5 |
| 123 | | | 60/40 | 30 | 30 | 20 | 0/10 | 1.0~1.3 |
| | | | | | | 40 | 0/10 | 1.0~1.5 |
| | | | | | | 60 | 0/10 | 1.2~1.5 |
| 124 | | | 70/30 | 35 | 35 | 20 | 3/10 | 0.2~0.4 |
| | | | | | | 40 | 3/10 | 0.5~1.0 |
| | | | | | | 60 | 1/10 | 0.5~1.2 |
| 125 | 2 | 2 | 50/50 | 0 | 50 | 20 | 9/10 | 0.2 |
| | | | | | | 40 | 10/10 | 0 |
| | | | | | | 60 | 3/10 | 0.5~1.0 |
| 126 | | | 30/70 | 15 | 15 | 20 | 4/10 | 0.2~0.5 |
| | | | | | | 40 | 2/10 | 0.5~1.0 |
| | | | | | | 60 | 1/10 | 0.8~0.9 |
| 127 | | | 40/60 | 20 | 20 | 20 | 0/10 | 1.1~1.5 |
| | | | | | | 40 | 1/10 | 1.2~1.3 |
| | | | | | | 60 | 0/10 | 1.2~1.5 |
| 128 | | | 50/50 | 25 | 25 | 20 | 0/10 | 0.8~1.1 |
| | | | | | | 40 | 0/10 | 1.0~1.3 |
| | | | | | | 60 | 0/10 | 1.2~1.5 |
| 129 | | | 60/40 | 30 | 30 | 20 | 1/10 | 1.0~1.2 |
| | | | | | | 40 | 0/10 | 1.2~1.5 |
| | | | | | | 60 | 0/10 | 1.1~1.4 |
| 130 | | | 70/30 | 35 | 35 | 20 | 2/10 | 0.5~0.8 |
| | | | | | | 40 | 3/10 | 0.5~1.0 |
| | | | | | | 60 | 2/10 | 0.3~1.2 |

TABLE 8

| No. | Glass composition No. | Ceramic composition No. | Glass/ceramic (ratio by weight %) | Glass heated with ceramics (wt. %) | Glass to be added later (wt. %) | Insulation layer thick. (μm) | Short circuit check defectives/samples | Break-down voltage (kv) |
|---|---|---|---|---|---|---|---|---|
| 131 | 3 | 3 | 40/60 | 2 | 38 | 20 | 3/10 | 0.2~0.5 |
| | | | | | | 40 | 1/10 | 0.5~0.8 |
| | | | | | | 60 | 1/10 | 1.0~1.2 |
| 132 | | | 40/60 | 5 | 35 | 20 | 1/10 | 0.5~0.7 |
| | | | | | | 40 | 1/10 | 1.0~1.5 |
| | | | | | | 60 | 10/10 | 1.0~1.5 |
| 133 | | | 40/60 | 10 | 30 | 20 | 1/10 | 1.2~1.4 |
| | | | | | | 40 | 0/10 | 1.0~1.5 |
| | | | | | | 60 | 0/10 | 1.2~1.5 |
| 134 | | | 40/60 | 15 | 15 | 20 | 0/10 | 1.0~1.3 |
| | | | | | | 40 | 0/10 | 1.0~1.5 |
| | | | | | | 60 | 0/10 | 1.2~1.4 |
| 135 | | | 40/60 | 20 | 20 | 20 | 1/10 | 1.0~1.3 |
| | | | | | | 40 | 0/10 | 1.3~1.5 |
| | | | | | | 60 | 0/10 | 1.0~1.4 |
| 136 | 4 | 4 | 50/50 | 5 | 45 | 20 | 1/10 | 0.8~1.2 |
| | | | | | | 40 | 1/10 | 1.0~1.3 |
| | | | | | | 60 | 10/10 | 1.0~1.5 |
| 137 | | | 50/50 | 10 | 40 | 20 | 0/10 | 1.2~1.3 |

TABLE 8-continued

| | | | Dielectric Strength Characteristics | | | | |
|---|---|---|---|---|---|---|---|
| No. | Glass composition No. | Ceramic composition No. | Glass/ceramic (ratio by weight %) | Glass heated with ceramics (wt. %) | Glass to be added later (wt. %) | Insulation layer thick. (μm) | Short circuit check defectives/samples | Break-down voltage (kv) |
| 138 | | | 50/50 | 15 | 35 | 40 | 0/10 | 1.0~1.5 |
| | | | | | | 60 | 0/10 | 1.2~1.4 |
| | | | | | | 20 | 0/10 | 1.0~1.2 |
| 139 | | | 50/50 | 20 | 30 | 40 | 1/10 | 0.8~1.4 |
| | | | | | | 60 | 0/10 | 1.2~1.5 |
| | | | | | | 20 | 0/10 | 1.0~1.3 |
| 140 | | | 50/50 | 25 | 25 | 40 | 0/10 | 1.0~1.5 |
| | | | | | | 60 | 0/10 | 1.2~1.4 |
| | | | | | | 20 | 1/10 | 1.2~1.4 |
| 141 | 5 | 5 | 60/40 | 10 | 50 | 40 | 0/10 | 1.0~1.5 |
| | | | | | | 60 | 0/10 | 1.2~1.5 |
| | | | | | | 20 | 0/10 | 1.0~1.3 |
| 142 | | | 60/40 | 15 | 45 | 40 | 0/10 | 1.0~1.5 |
| | | | | | | 60 | 0/10 | 1.2~1.5 |
| | | | | | | 20 | 0/10 | 1.2~1.3 |
| 143 | | | 60/40 | 20 | 40 | 40 | 0/10 | 1.2~1.5 |
| | | | | | | 60 | 0/10 | 1.2~1.5 |
| | | | | | | 20 | 0/10 | 1.2~1.4 |
| 144 | | | 60/40 | 30 | 30 | 40 | 1/10 | 1.0~1.5 |
| | | | | | | 60 | 0/10 | 1.2~1.5 |
| | | | | | | 20 | 0/10 | 1.2~1.3 |
| 145 | | | 60/40 | 40 | 20 | 40 | 0/10 | 1.0~1.5 |
| | | | | | | 60 | 0/10 | 1.2~1.5 |
| | | | | | | 20 | 0/10 | 1.0~1.5 |
| 146 | 6 | 1 | 40/60 | 20 | 20 | 40 | 0/10 | 1.0~1.5 |
| | | | | | | 60 | 0/10 | 1.2~1.4 |
| | | | | | | 20 | 0/10 | 0.8~1.2 |
| | | | | | | 20 | 1/10 | 1.0~1.4 |
| 147 | | | 50/50 | 25 | 25 | 60 | 0/10 | 1.2~1.5 |
| | | | | | | 20 | 0/10 | 1.0~1.5 |
| | | | | | | 40 | 0/10 | 1.2~1.4 |
| 148 | | | 60/40 | 30 | 30 | 60 | 0/10 | 1.0~1.5 |
| | | | | | | 20 | 0/10 | 1.2~1.3 |
| | | | | | | 40 | 0/10 | 1.2~1.5 |
| 149 | 7 | 3 | 40/60 | 20 | 20 | 60 | 0/10 | 1.2~1.5 |
| | | | | | | 20 | 1/10 | 1.0~1.3 |
| | | | | | | 40 | 0/10 | 1.0~1.5 |
| 150 | | | 50/50 | 25 | 25 | 60 | 0/10 | 1.2~1.5 |
| | | | | | | 20 | 0/10 | 1.3~1.5 |
| | | | | | | 40 | 1/10 | 1.2~1.5 |
| 151 | | | 60/40 | 30 | 30 | 60 | 0/10 | 1.0~1.5 |
| | | | | | | 20 | 0/10 | 1.2~1.3 |
| | | | | | | 40 | 0/10 | 1.2~1.4 |
| 152 | 8 | 5 | 40/60 | 40 | 20 | 60 | 0/10 | 1.0~1.5 |
| | | | | | | 20 | 0/10 | 1.3~1.4 |
| | | | | | | 40 | 0/10 | 1.2~1.5 |
| 153 | | | 50/50 | 25 | 25 | 60 | 0/10 | 1.2~1.5 |
| | | | | | | 20 | 1/10 | 1.0~1.2 |
| | | | | | | 40 | 0/10 | 1.3~1.5 |
| 154 | | | 60/40 | 30 | 30 | 60 | 0/10 | 1.2~1.4 |
| | | | | | | 20 | 0/10 | 1.0~1.4 |
| | | | | | | 40 | 0/10 | 1.2~1.5 |
| | | | | | | 60 | 0/10 | 1.2~1.5 |

We claim:

1. A dielectric paste which comprises a ceramic comprising 90 to 98 wt.% of $Al_2O_3$, 1 to 5 wt.% of $SiO_2$, 0.2 to 2 wt.% of CaO, and 0.5 to 4 wt.% of MgO, with the total weight reaching 100%; a borosilicate glass; and an organic liquid vehicle wherein the ratio of the glass to the ceramic by weight is 40/60 to 60/40.

2. A dielectric paste as set forth in claim 1, wherein the composition of the borosilicate glass is comprises 60 to 90 wt.% of $SiO_2$, 5 to 30 wt.% of $B_2O_3$, 0.1 to 10 wt.% of $Al_2O_3$, 0.1 to 10 wt.% of BaO, and 0.01 to 5 wt.% of $M_2O$ in which M is an alkaline metal, with the total weight reaching 100%.

3. A dielectric paste as set forth in claim 1, wherein the ceramic composition is comprises 90 to 98 wt.% of $Al_2O_3$, 1 to 5 wt.% of $SiO_2$, 0.2 to 2 wt.% of CaO, and 0.5 to 4 wt.% of MgO, with the total weight reaching 100%, and the composition of the borosilicate glass is comprises 60 to 90 wt.% of $SiO_2$, 5 to 30 wt.% of $B_2O_3$, 0.1 to 10 wt.% of $Al_2O_3$, 0.1 to 10 wt.% of BaO, and 0.01 to 5 wt.% of $M_2O$ in which is an alkaline metal, with the total weight reaching 100%.

* * * * *